US012549195B2

(12) United States Patent
Paillet et al.

(10) Patent No.: US 12,549,195 B2
(45) Date of Patent: Feb. 10, 2026

(54) DIGITAL IPSG, 2-LEVEL DAC AND FLASH ADC

(71) Applicant: Intel Corporation, Santa Clara, CA (US)

(72) Inventors: Fabrice Paillet, Portland, OR (US); Jason Muhlestein, Beaverton, OR (US); James Keith Hodgson, Hillsboro, OR (US); Shivadarshan Bidadi Rajeurs, Hillsboro, OR (US); George Matthew, Beaverton, OR (US); Anand Ramasundar, Portland, OR (US); Cary Renzema, North Plains, OR (US); Po-Cheng Chen, Tigard, OR (US); Sergio Carlo Rodriguez, Hillsboro, OR (US); Seng Rou Tey, Penang (MY)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 17/561,136

(22) Filed: Dec. 23, 2021

(65) Prior Publication Data

US 2023/0208432 A1 Jun. 29, 2023

(51) Int. Cl.

| | |
|---|---|
| ***H03M 1/78*** | (2006.01) |
| ***G05F 1/575*** | (2006.01) |
| ***G05F 1/59*** | (2006.01) |
| ***H02M 1/00*** | (2007.01) |
| ***H02M 3/157*** | (2006.01) |

(52) U.S. Cl.

CPC ............ *H03M 1/785* (2013.01); *G05F 1/575* (2013.01); *G05F 1/59* (2013.01); *H02M 1/0025* (2021.05); *H02M 3/157* (2013.01); *H03M 1/78* (2013.01)

(58) Field of Classification Search

CPC ...... H03M 1/785; H03M 1/78; H02M 1/0025; H02M 3/157; G05F 1/575; G05F 1/59

USPC .......................................... 341/144–145, 154

See application file for complete search history.

(56) References Cited

U.S. PATENT DOCUMENTS

| | | | | |
|---|---|---|---|---|
| 3,997,892 A * | 12/1976 | Susset | H03M 1/16 | 341/145 |
| 7,079,065 B2 * | 7/2006 | Wang | H03M 1/68 | 341/145 |
| 8,217,870 B2 * | 7/2012 | Woo | G09G 3/3688 | 345/87 |
| 8,339,460 B2 * | 12/2012 | Yamasaki | H04N 7/035 | 348/181 |

* cited by examiner

*Primary Examiner* — Khai M Nguyen

(74) *Attorney, Agent, or Firm* — NICHOLSON DE VOS WEBSTER & ELLIOTT LLP

(57) ABSTRACT

An apparatus, system, and method for digital-to-analog (converter) control are provided. A DAC includes a first resistor ladder including a plurality of first electrical taps into different portions of the first resistor ladder, first and second pass gate trees coupled to receive outputs from the first electrical taps, first and second buffers coupled to receive outputs from the first and second pass gate trees, respectively, a second resistor ladder coupled to receive and be biased by outputs of the first and second buffers, the second resistor ladder including a plurality of second electrical taps into different portions of the second resistor ladder, and third, fourth, and fifth pass gate trees coupled to receive outputs from the second electrical taps.

19 Claims, 11 Drawing Sheets

DIGITAL IPSG, 2-LEVEL DAC AND FLASH ADC

TECHNICAL FIELD

Embodiments pertain to voltage regulators (VRs). Some embodiments relate to digital linear (DL) VRs (DLVRs) with an integrated periodic signal generator (IPSG), a two-stage programmable multi-level digital-to-analog converter (DAC) for a windowed flash analog-to-digital converter (ADC).

BACKGROUND

Digital voltage regulators require a conversion from an analog sense voltage to a digitally encoded error signal that can be consumed by the controller. A windowed flash ADC achieves high resolution and a high-speed conversion rate. The ADC is generally composed of a set of comparators with one input shorted to the sense voltage and another input tied to respective various voltage thresholds which represent different amounts of "error" from the setpoint voltage. Prior designs have relied on ADCs with equally spaced, non-programmable thresholds which are simple to design but do not give any flexibility to adjust the conversion gain to address non-linearity and quantization tradeoffs.

An integrated periodic signal generator (IPSG) injects signals into closed loop systems. The injected signals are used to characterize the small signal (i.e. linear) frequency response of integrated voltage regulators. For IPSGs in analog voltage regulators, the response is generally the most linear when the signal perturbing the system is very small. In digital voltage regulators (DVRs), analog-to-digital converter (ADC) quantization causes the response to small signals to be highly non-linear, making it difficult to interpret the results of a test. Large signals overcome the quantization effect and linearize the ADC response, but the large signals can cause a non-linearity in analog parts of the loop.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

DETAILED DESCRIPTION

Figure 1:
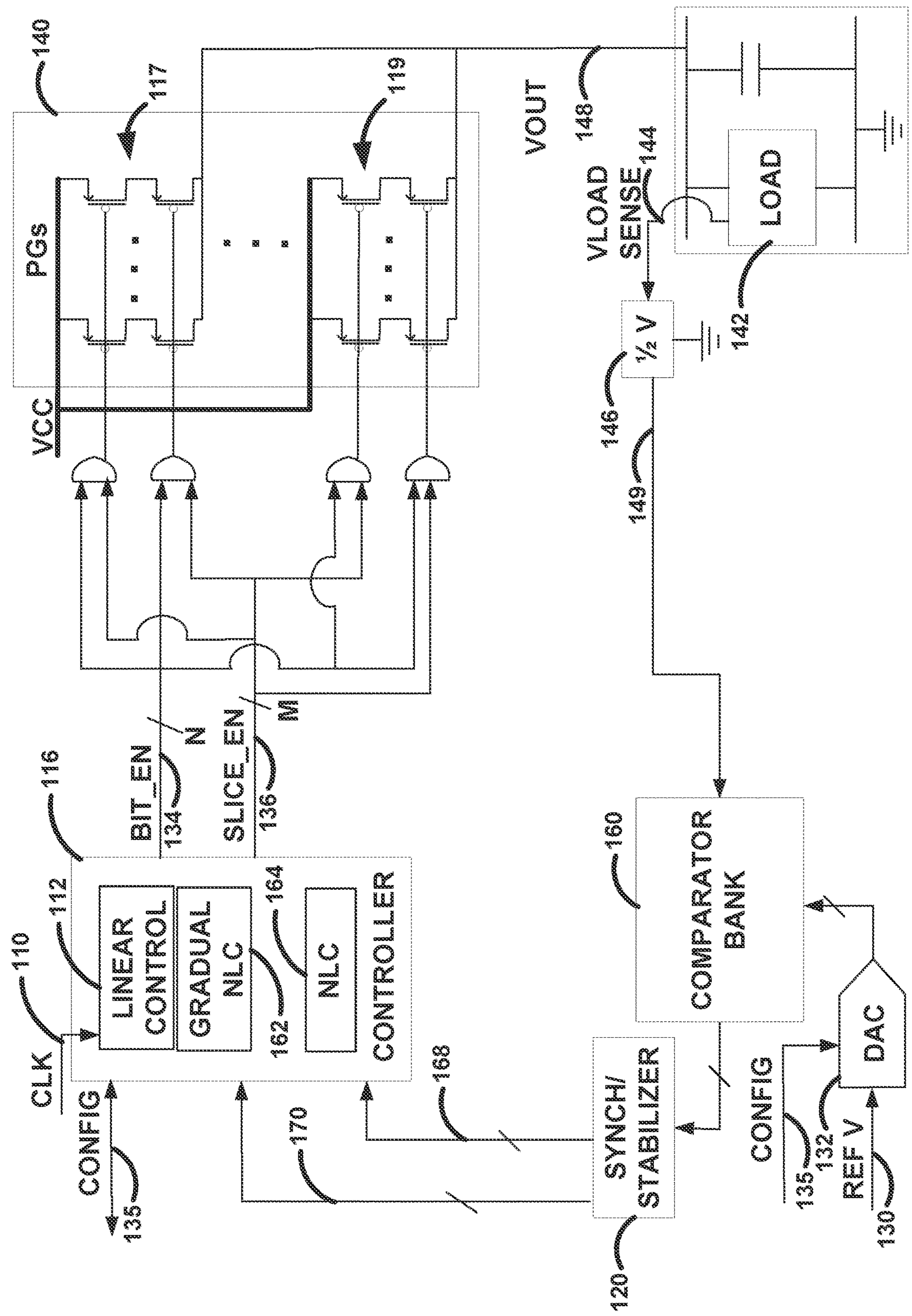
FIG. 1 illustrates, by way of example, a circuit diagram of a voltage regulator (VR) system with a hybrid controller that operates using linear control (LC), gradual non-linear control (NLC), and NLC control.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

A Two-Stage Programmable Multi-Level Dac for a Windowed Flash Adc

A prior implementation of a DAC decoded a voltage identification (VID) code into two 7-bit VID codes that selected tap points out of a single resistor ladder to drive a pair of unity gain buffers (UGBs). The outputs of the UGBs were connected by a resistor ladder with fixed tap points to generate the voltage thresholds for a comparator array. Because it used a single 7-bit ladder DAC, the DSLDO had only a 10 mV VID resolution and no flexibility in setting comparator thresholds with respect to each other. Also, this DAC employed an even number of comparators which creates a "dead zone" between the middle two comparators in which the controller is essentially doing nothing. Theoretically this may seem good because if the output voltage falls between them then the controller is set just right and does not need to adjust any power gate to maintain regulation. In practice, however, this middle voltage window must be very small to avoid large ripple or dithering at the output, so the ADC, in practice includes the middle two comparators constantly toggling and the output voltage back and forth between the respective thresholds of the two comparators.

Embodiments can include a two stage DAC with a first stage comprising a resistor ladder of a first specified number of bits driving inputs of two UGBs and a second stage resistor ladder of a second specified number of bits and a third specified number of outputs. The second stage is driven by the outputs of the UGBs. If the first specified number of bits is six and the second specified number of bits is seven an overall resolution of 13 bits at each output can be realized. For a 1 Volt reference voltage this equates to sub-milliVolt resolution. In embodiments in which there is a reference voltage (VREF), four linear control (LC) thresholds, two gradual non-linear control (NLC) thresholds, and two NLC thresholds, there are an odd number of comparators (nine total) so that a single center comparator is responsible for output voltage dithering at steady state rather than bouncing between two comparators with a dead zone. Each of the second-level DAC outputs has full programmability within the second stage DAC so thresholds can be set as close together or far apart as desired to give flexibility in tradeoffs such as noise, linearity, total control range, etc. A "blanking" feature can help reduce glitching during VID changes.

Reference will now be made to the FIGS. to describe details of embodiments. The FIGS. proceed by, first, describing an overall architecture of a DLVR and then describing the two-stage DAC and features thereof in more detail.

FIG. 1 illustrates, by way of example, a circuit diagram of a VR system with a hybrid controller 116 that operates using LC, gradual NLC, and NLC control. To supply current to a load 142 while regulating VLOAD 144 at given reference value, the VR controller 116 can operate metal oxide semiconductor (MOS) (or other semiconductor type) power gate (PG) slices 117, 119. Each of the slices 117, 119 are coded with binary weighted PGs where b[0] indicates a least significant bit (LSB) PG device and b[P] indicates the most significant bit (MSB) PG device. Note that the MSB device is effectively about 2^(P) (e.g., if P=15 then the MSB device is 32768) times larger than the LSB device. Each of the PG devices is illustrated as including a stacked configuration (series of two devices). The "lower" device of the stack can be driven by a mid-rail voltage for overstress protection while the upper device can be controlled by the level control logic generated by the digitally implemented 'decision logic' block. Note that while the upper devices are logically ON or OFF, the logic levels between which they are switching are not necessarily full swing and may instead be intermediate bias voltages to limit the ON current.

A comparator bank 160 receives reference voltages from a DAC 132. The reference voltages control when LC circuitry 112 (circuitry that implements LC, such as a proportional integral-derivative (PID) control), gradual NLC circuitry 162 (circuitry that implements gradual NLC that injects a specified increase or decrease to the PG code 166 (see FIG. 9) by a first increment responsive to a sufficiently large change in load), or NLC circuitry 164 (circuitry that implements NLC that implements, for example, a binary search technique to find a PG code 166 that pushes the output voltage towards nominal) operates to alter the PG code 166. Each of the LC, gradual NLC, and NLC can have one or more overshoot thresholds, one or more undershoot thresholds, or a combination thereof, associated therewith and provided by the DAC 132. If each of the LC, gradual NLC, and NLC include a single overshoot and undershoot threshold, the comparator bank 160 can include seven comparators that each receive an output voltage 149 at a first input and an NLC undershoot threshold voltage, a gradual NLC undershoot threshold voltage, an LC undershoot threshold voltage, a reference voltage, an LC overshoot threshold voltage, a gradual NLC overshoot threshold voltage, and an NLC overshoot threshold voltage, respectively, at a second input. The threshold voltages are listed, in order, from lowest voltage to highest voltage.

The VR controller 116 decides which control technique, the synchronous LC technique implemented by the LC circuitry 112 or the asynchronous NLC technique implemented by the NLC circuitry 164 to implement based on comparator output 168. Each comparator of the comparator bank 160 receives 50% (or other percentage, of the output voltage (VLOAD 144) signal from a voltage divider 146 at one input and the other input can be fed from multiple digital to analog converters (DACs) or a single DAC 132 with multiple outputs. A stable reference voltage (REF V 130) can provide the DAC 132 with a reference voltage to produce the threshold voltages. These threshold voltages set the threshold at which NLC and LC are triggered by the VR controller 116.

The VR controller 116 controls VOUT 148 and ultimately VLOAD 144 by changing the binary code provided to the PGs 140. The binary code (PG code 166 (see FIG. 9)) is set dynamically using BIT_EN and statically using SLICE_EN variables that control voltage on control traces 134, 136, respectively. Depending on the LC (e.g., PID) settings, the VR controller 116 can maintain a voltage within a narrow band of +/−5 mV or less around a target Voltage ID (VID), the nominal voltage.

VLOAD 144 can be sensed, then divided by 2 (or another real number or integer) by the voltage divider 146, before being sent to analog circuitry (e.g., the comparators of the comparator bank 160). Hence, the analog circuitry can operate in a "half-voltage" or other partial voltage domain.

The analog circuitry can include a 2-stage DAC (e.g., to save area). The first level of the DAC can include a 50-step (or other number of steps) resistive ladder, fed by a trimmed, external system on chip (SoC) band-gap reference of 1V (or other reference voltage level). Assuming 50 steps and a 1V REF V 130, the first level of the DAC can produce 20-mV steps and is used to generate a 160-mV range, which can be buffered (using two unity gain buffers (UGBs)) and can provide high and low voltage reference voltages for a second level resistive DAC ladder, comprising 256 steps (or other number of steps). Assuming a 256 step second level resistive ladder along with a 50 step first level resistive ladder and a 1V REF V 130 results in a final DAC resolution of 0.625 mV. Since the DAC voltage domain represents half the load domain, each DAC step of 0.625 mV corresponds to 1.25 mV at the load 142. A specified number of voltage levels, corresponding to the number of comparators in the comparator bank 160, can be provided from the second level of the DAC 132 (e.g., using separate pass gate trees), and the comparator bank 160 can be used to compare the voltage to the voltage 149. If VLOAD 144 is within +/−5 mV of the target VID (2.5 mV in the "half domain"), then it can be deemed to be nominal by the VR controller 116. But if VLOAD 144 is either within the top, bottom, or middle LC zones (either (i) a first comparator indicates a voltage 149 is greater than the LC overshoot threshold while a second comparator indicates that the voltage 149 is less than a gradual NLC overshoot threshold, (ii) a third comparator indicates the voltage 149 is less than the LC undershoot threshold while a fourth comparator indicates that the voltage 149 is greater than the gradual NLC undershoot threshold, or (iii) the first comparator indicates the voltage 149 is less than the LC overshoot threshold and the third comparator indicates the voltage 149 is greater than the LC undershoot threshold), then the digital controller applies the LC technique implemented by the LC circuitry 112 to increase (or decrease) the PG code 166 (see FIG. 9) and try to bring the voltage 149 back to nominal. If linear control fails to achieve its goal in time, and the voltage 149 becomes either larger than the gradual NLC overshoot or NLC overshoot thresholds or smaller than the gradual NLC undershoot or NLC undershoot thresholds, then the VR controller 116 can activate the gradual NLC circuitry 162 or the NLC circuitry 164 that implements the gradual NLC or NLC to change the PG code 166 and adjust voltage 149 back within the LC overshoot threshold or the LC undershoot threshold.

The outputs of the comparators of the comparator bank 160 can be protected against meta-stability in case the voltage 149 hovers around a threshold voltage produced by the DAC 132. This helps guarantee PG code 166 (see FIG. 9) determinism. The meta-stability protection can be provided by a circuitry-based synchronizers/stabilizers 120. The synchronizers/stabilizers 120 can include a meta stability filter that prevents undefined values from propagating to the VR controller 116. Circuitry-based synchronizers/stabilizers 120 can keep the output 168 of the comparators in sync with a clock 110. This keeps the LC circuitry 112 synchronous. Note that no such synchronous clocking is used in the NLC circuitry 164 or the gradual NLC circuitry 162 making the NLC and gradual NLC asynchronous. An asynchronous output 170 is provided from the synchronizers/stabilizers 120 to the asynchronous control circuitry, NLC circuitry 164 and gradual NLC circuitry 162.

The DAC 132 can be programmable by configuration data 135. The configuration data 135 can define the tap points of pass gate trees and thus control the voltage provided to a comparator of the comparator bank 160. More details are provided elsewhere.

Figure 2:
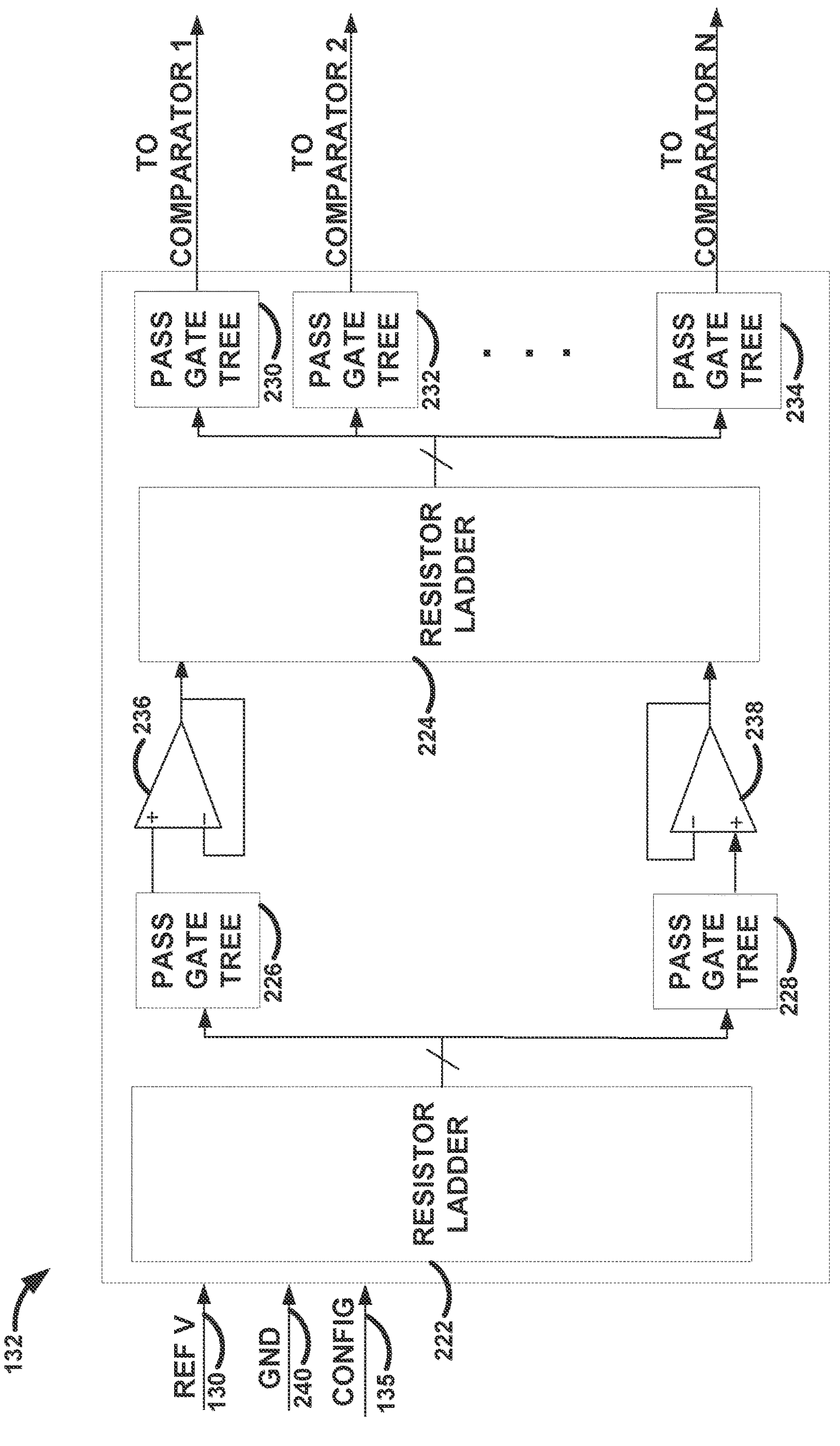
FIG. 2 illustrates, by way of example, a circuit diagram of an embodiment of a two-stage digital-to-analog converter (DAC).

FIG. 2 illustrates, by way of example, a circuit diagram of an embodiment of a two-stage DAC 132. The DAC 132 as illustrated includes a first resistor ladder 222, pass gate trees 226, 228 situated in an electrical path between the first resistor ladder 222 and UGBs 236, 238, respectively. The UGBs 236, 238 provide upper and lower voltages to a second resistor ladder 224. The second resistor ladder 224 produces a number of outputs that are each provided by a pass gate tree 230, 232, 234. Each of the pass gate trees 230, 232, 234 provides a threshold voltage to a corresponding comparator of the comparator bank 160. In the example of FIG. 2, there are two pass gate trees 226, 228 between the first resistor ladder 222 and the UGBs 236, 238 and there are N (an integer 3 or greater) pass gate trees 230, 232, 234 between the second resistor ladder 224 and the comparator bank 160. N is odd in some embodiments.

The first resistor ladder 222 is a fixed resistor with a plurality of taps therein. Each tap provides a different voltage that is proportional to a total amount of resistance between the tap and ground 240. If REF V 130 is 1 Volt and GND 240 is 0 volts and there are eight equally spaced taps, eight different voltages can be passed by the resistor ladder 222, namely [0V, $\frac{1}{6}$ V, $\frac{2}{6}$ V, $\frac{3}{6}$ V, $\frac{4}{6}$ V, $\frac{5}{6}$ V, 1 V]. The voltage corresponding to the lowest tap, defines the lowest voltage that can be passed to the comparator bank 160.

The pass gate tree 226, 228 includes levels of switches or multiplexers (typically implemented using negative metal oxide semiconductor (NMOS) and positive metal oxide semiconductor (PMOS) transistors) that allow a voltage at any of the taps to be passed to the output of the pass gate tree 226, 228. A user can select the tap by setting the configuration data 135 to a specified value. The configuration data 135 can include a value indicating a tap on the first resistor ladder 222 and a value indicating a tap on the second resistor ladder 224.

The UGBs 236, 238 provide a buffer between the first resistor ladder 222 and the second resistor ladder 224. The UGBs 236, 238 help prevent the second resistor ladder 224 from loading the first resistor ladder 222 and changing the electrical characteristics of the output of the first resistor ladder 222. A difference between voltages of the chosen tap points of the first resistor ladder 222 provide a fixed voltage across the second resistor ladder 224. The second resistor ladder 224 then divides that fixed voltage based on the number of tap points in the second resistor ladder 224.

Assuming the first resistor 222 ladder has an effective 7 resistors in series which creates 8 total tap points, the second resistor ladder 224 has an effective eight resistors with a total of nine tap points, a reference voltage of 1V, and the second resistor ladder 224 only spanning a single first resistor ladder 222 range, one can step from 0V to 1v in $\frac{1}{56}$V steps though any outputs from the second resistor ladder 224 are within $\frac{1}{7}$V from each other.

The DAC 132 provides for flexibility in which comparator of the comparator bank 160 receives which voltage threshold, what the voltage threshold is set to, and ultimately in shaping the linear response of the controller 116.

Figure 3:
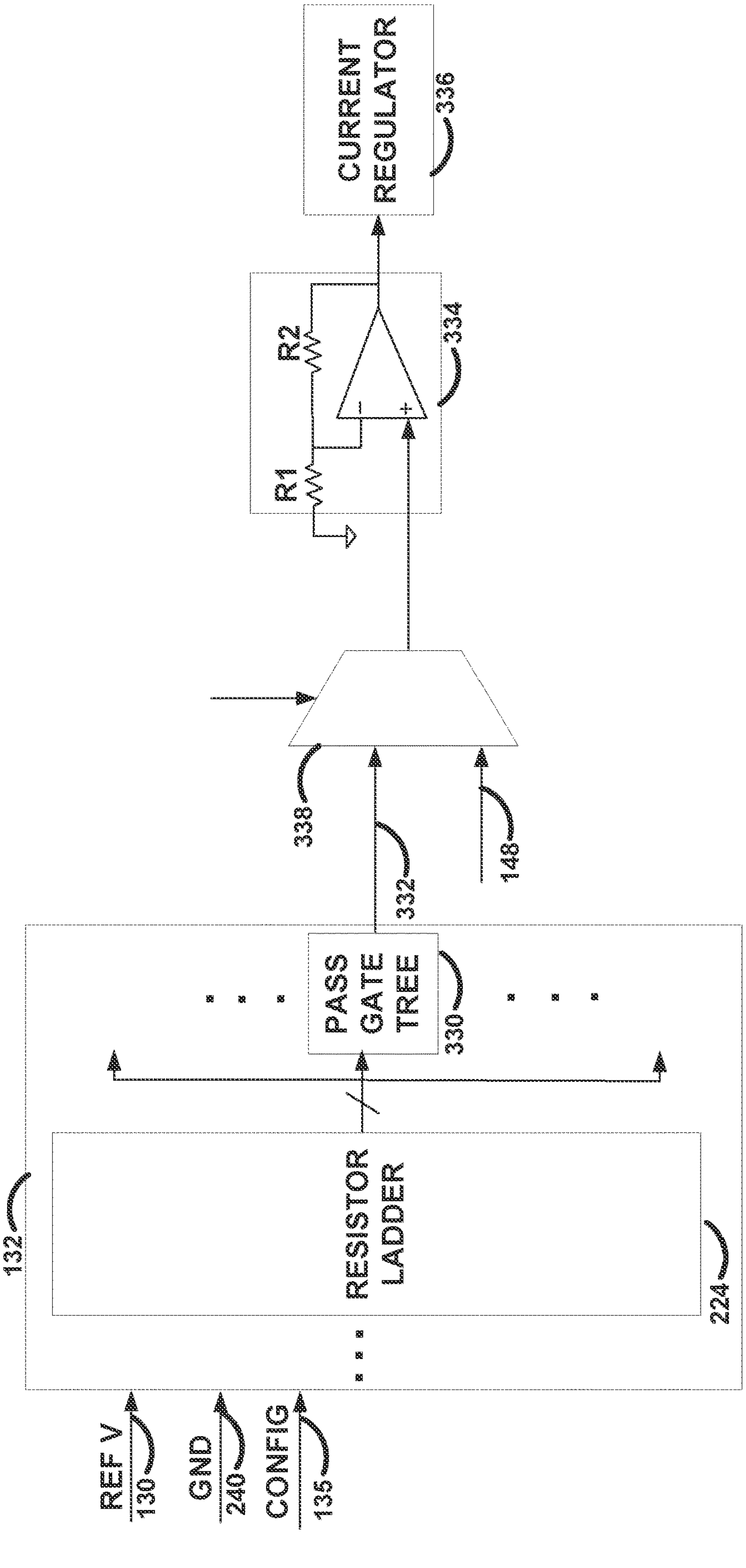
FIG. 3 illustrates, by way of example, a block diagram of an embodiment of circuitry for current regulation in a digital linear voltage regulator (DLVR). The current regulation can be provided by a current regulator.

FIG. 3 illustrates, by way of example, a block diagram of an embodiment of circuitry for current regulation in a DLVR. The current regulation can be provided by a current regulator 336. A current regulator provides a current that is generally independent of voltage at its input and output. The current regulator 336 of the DLVR can provide a means of maintaining a set current in the devices of the PGs 117 and 119 when they are turned on by BIT_EN. This current regulation includes the current regulator 336 sensing the VOUT 148 or a voltage that is equivalent to VOUT 148.

The DAC 132 can provide the threshold voltages to the comparators of the comparator bank 160. The number of comparators can be odd, such that the voltage provided by the controller 116 is regulated to the middle threshold voltage of all the threshold voltages. A pass gate tree 330 provides the middle threshold voltage to the middle comparator (the comparator of the comparator bank 160 that receives the middle threshold voltage). In some examples, this middle threshold voltage is called a "reference voltage" or "VREF", because this is the ideal output voltage 149. The current regulator 336 can receive VREF*constant from a multiplier 334, where the constant in the example illustrated is 1+R2/R1. Thus, the DAC 132 can supply the voltage that operates the current regulator 336 in some circumstances. While the example described regarding FIG. 3 regards the middle threshold voltage, a different, non-middle threshold voltage can be used to generate the voltage that drives the current regulator 336.

A multiplexer 338 can be controlled to provide either the output voltage 148 (or a divided version of the output voltage (e.g., voltage 149)) and output 332 of the pass gate tree 330. The current regulator 336 can operate primarily based on current feedback (the output voltage 148), but can operate based on the output 332 to handle second order effects inside the regulator 336.

Changing tap points on the resistor ladders 122, 124 is a noisy operation. This is, at least in part, because there are so many different inputs from the DAC 132 going to the comparator bank 160. The changes in the pass gate trees 226, 228, 230, 232, 234, or 330 turning on or off generates noise on the input to the comparators of the comparator bank 160. That noise causes the output of the regulator to respond in an unpredictable manner. To avoid the noise, the comparators of the comparator bank 160 can be electrically isolated from the switching pass gate trees 226, 228, 230, 232, 234, or 330 during the switching action. The electrical isolation prevents the noise generated from switching the tap points from propagating to the controller 116. After the inputs to the comparators of the comparator bank 160 have settled to the (possibly) new voltage level, the comparators can be re-connected to the controller 116. The feature that prevents the noise from propagating to the controller 116 is called a "blanking" feature.

Figure 4:
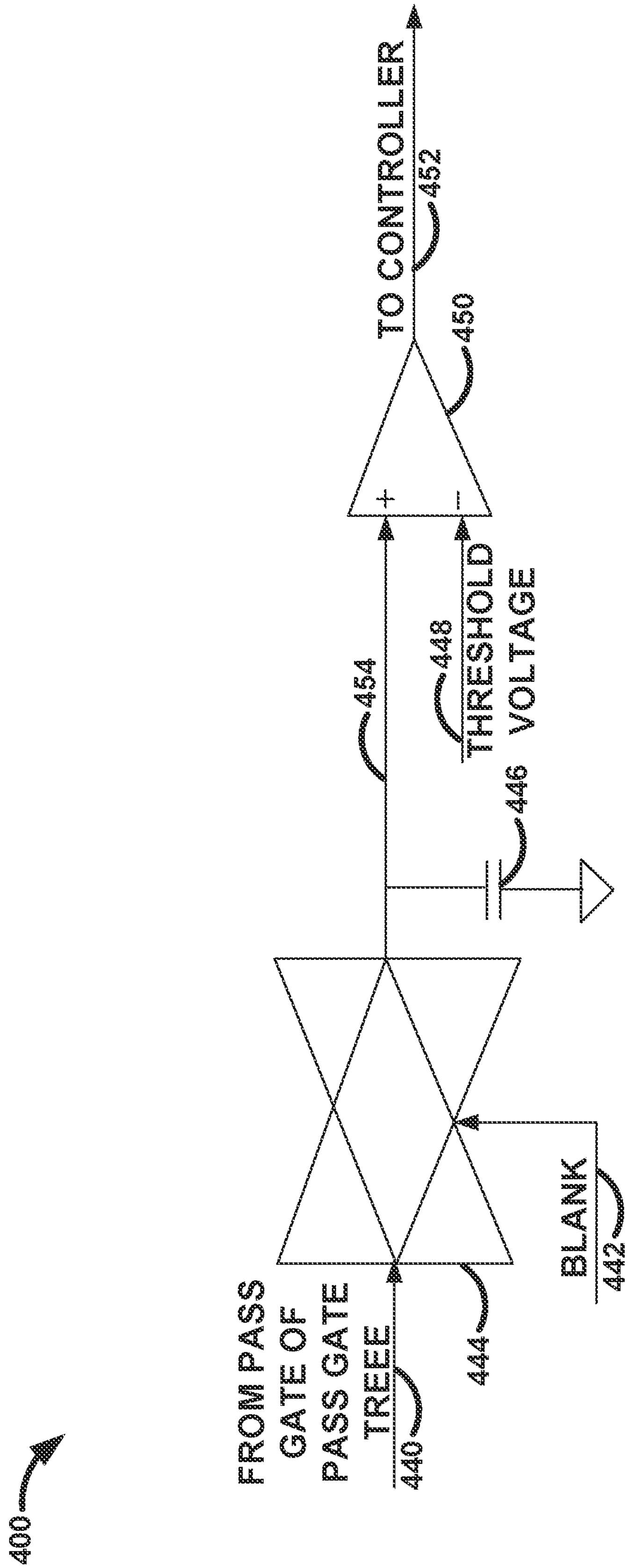
FIG. 4 illustrates, by way of example, a diagram of an embodiment of blanking feature circuitry coupled to a comparator of the comparator bank.

FIG. 4 illustrates, by way of example, a diagram of an embodiment of blanking feature circuitry 400 coupled to a comparator 450 of the comparator bank 160. The blanking feature circuitry 400 includes a pass gate 444 of one of the pass gate trees 230, 232, 234, 330 coupled between the second resistor ladder 224 and the comparator bank 160. The pass gate 444 is a final pass gate of a given pass gate tree 230, 232, 234, 330 before the comparator 450. The pass gate 444 receives a voltage 440 from a pass gate coupled immediately upstream in the pass gate tree 230, 232, 234, 330. The pass gate 444 is controlled by a blank signal 442. The blank signal 442, when asserted (or de-asserted if negative logic is used), causes the pass gate 444 to block the voltage 440. The blank signal 442, when de-asserted (or asserted if negative logic is used), causes the pass gate 444 to pass the voltage 440. The voltage 440, when passed to the comparator 450, charges the capacitor 446. The comparator 450 is one of the comparators of the comparator bank 160 that provides data 452 to the controller 116 indicating whether a voltage 454 from the pass gate 444 exceeds a threshold voltage 448 (e.g., the NLC undershoot threshold voltage, the gradual NLC undershoot threshold voltage, the LC undershoot threshold voltage, the reference voltage, the LC overshoot threshold voltage, the gradual NLC overshoot threshold voltage, and the NLC overshoot threshold voltage).

When the blank signal 442 is asserted, the capacitor 446 maintains the voltage at the comparator 450 while the pass gates of the pass gate tree 230, 232, 234, 330 are switching and noise is induced on the voltage 440. The duration of the blank signal 442 being asserted can be deterministic (e.g., a number of clock cycles of the clock 110), based on sensing the voltage 440 has settled, or the like.

The blank signal 442 can be provided to all final pass gates 444 of all pass gate trees 230, 232, 234, 330 situated between the second resistor ladder 224 and the comparator bank 160. Similarly, a capacitor 446 can be situated at the input of each comparator 450 to provide a determinable voltage during assertion of the blank signal 442.

Figure 5:
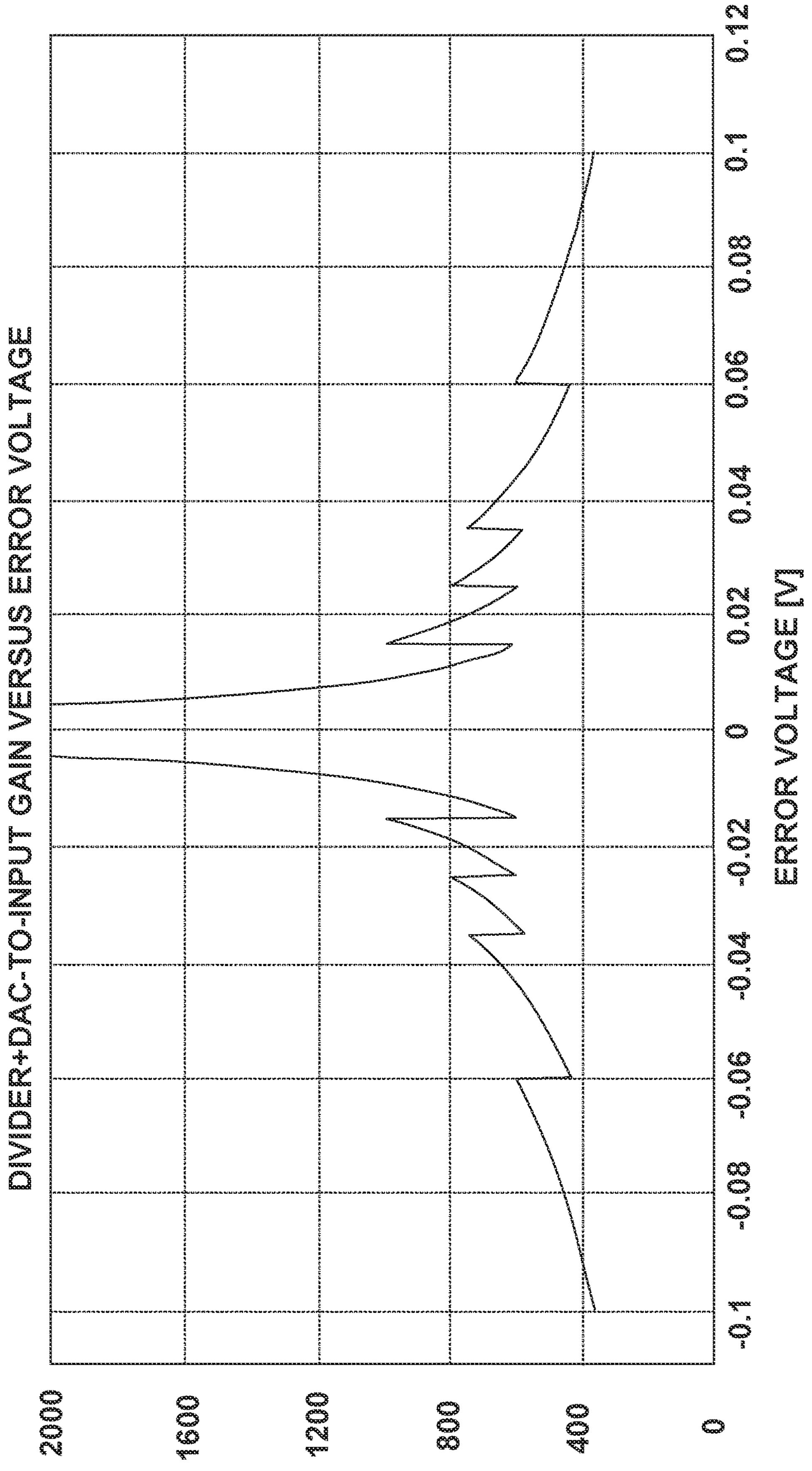
FIG. 5 illustrates, by way of example, a graph of divider+DAC-to-input gain versus error voltage.

FIG. 5 illustrates, by way of example, a graph of divider+DAC-to-input gain versus error voltage. The linear gain from voltage sense to error code is shown in the plot in FIG. 5. The height of each threshold is set by an error table that defines the error code to be provided responsive to tripping a corresponding comparator. The spacing between threshold voltages is set by the second resistor ladder 224. By having the ability to tune each threshold voltage individually, the shape of the gain transfer (the plot of FIG. 5) can be modified to have smaller or larger non-linearity at different amplitudes of voltage error. This flexibility allows for optimizing the controller 116 for droop and steady state noise through tuning of the threshold voltages. Gain is the change in error code divided by the change in voltage.

Different comparators of the comparator bank 160 being tripped (which determines that the output voltage 149 is greater or less than the input threshold voltage) provides a different error code for the controller 116 to operate with. The error code depends on the magnitude of the error in the output voltage 149 (difference between the output voltage 149 and the middle threshold voltage).

The comparators of the comparator bank 160 will have random variations from manufacturing processes that can nullify close threshold voltages (threshold voltages within manufacturing tolerances). An offset variation from manufacturing (meaning that the two inputs of the comparator may not be exactly equal voltages at the point at which the competitor is switching from low to high or vice versa) and the threshold voltages close to each other (within manufacturing tolerances), may prevent the comparators from tripping in an order that is expected or needed for proper operation. Digitally trimming the comparators by adjusting their threshold voltage based on a manufacturing offset can help alleviate this problem. This is called digital trimming. The DAC 132 with two resistor ladders 222, 224 and corresponding pass gate trees 226, 228, 230, 232, 234, 330 provides sufficient resolution for digitally trimming out much of the error.

For digital trimming, a specified input to the comparator 450 corresponds to a specified output from the comparator 450. For example, 200 milli-Volts as the threshold voltage input corresponds to 500 milli-Volts at the output. The output voltage 149 is provided to the other input of the comparator 450. The threshold voltage input to the comparator 450 can be held constant while the other input to the comparator 450 is swept through its range which includes voltages greater than and less than the threshold voltage. If the input trips the comparator 450 output at a voltage above or below the threshold voltage, the threshold voltage can be biased to adjust for the variation. The bias adjustment includes changing the tap point on the second resistor ladder 224 that provides the threshold voltage for the comparator 450. Analog trimming can also be performed to further help adjust for manufacturing variation.

Figure 6:
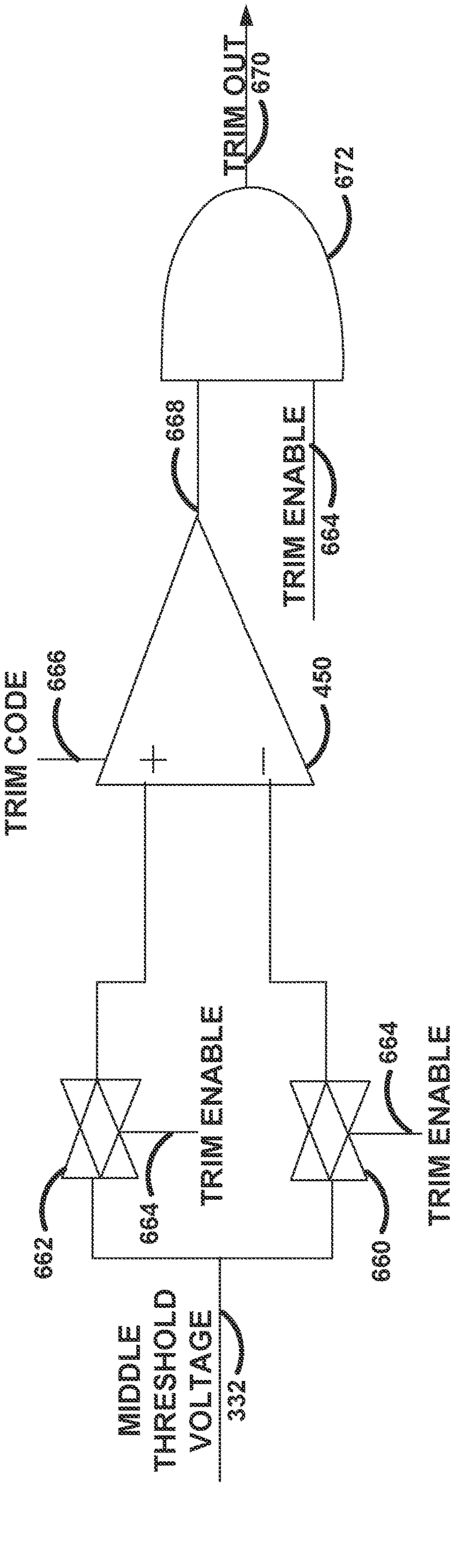
FIG. 6 illustrates, by way of example, a diagram of an embodiment of trim circuitry for determining an analog offset trim offset for a threshold voltage.

FIG. 6 illustrates, by way of example, a diagram of an embodiment of trim circuitry for determining an analog offset trim offset for a threshold voltage. The trim circuitry includes pass gates 660, 662 that can be forced to pass the middle threshold voltage 332 based on a trim enable signal 664. The positive and negative sides of the comparator 450 are tied to a same voltage based on the trim enable signal 664. If the trim enable signal 664 is asserted (or de-asserted if negative logic is used) the inputs of the comparator 450 are driven at the middle threshold voltage 332 (by the DAC 132). The comparator 450 is provided a trim code 666 (a digital voltage). The trim code 666 is input to an internal transistor pair of the comparator 450. The trim code 666 is swept through its digital range. A value of the trim code 666 at which the comparator 450 changes voltage on output 668 is determined based on output 670 of an AND gate 672 (other equivalent logic to the AND gate is possible and known). The comparator 450 can be analog trimmed at the value corresponding to the trim code 666 at the time the output of the AND gate 672 went high.

Figure 7:
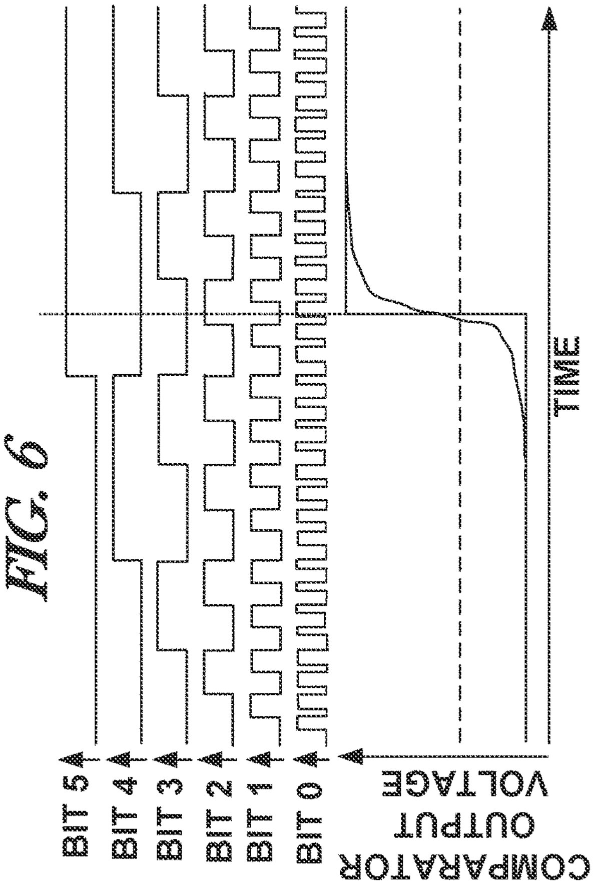
FIG. 7 illustrates, by way of example, a diagram of an embodiment of a graph of voltage versus time for the trim code (bits [5:0]) and comparator output voltage below the bits of the trim code.

FIG. 7 illustrates, by way of example, a diagram of an embodiment of a graph of voltage versus time for the trim code 666 (bits [5:0]) and voltage of the comparator output 668 is shown below the bits of the trim code 666. The trim code 666 is swept through all of its values. The trim code value in the example of FIG. 7 is about b'100101 or 37 in base 10. In general, an analog trim code in about the middle of the total trim range (about 31 or 32 in the example of a six-bit digital trim in this example) is desired.

The trim code 666 adjusts inputs to the differential pair of the comparator 450. The differential pair is two sets of transistors that look identical to each other and each of them has a Bank of "spare" transistors that are enabled or disabled by the trim code 666.

Digital Ipsg Mixed-Mode Control Loop Characterization

IPSGs inject signals into closed loop systems that are used to characterize the small signal (i.e. linear) frequency response of integrated voltage regulators. For IPSGs in analog voltage regulators, the response is generally the most linear when the signal perturbing the system is very small. In DVRs, ADC quantization causes the response to small signals to be highly non-linear, making it difficult to interpret the results of a test. Large signals in the DVRs overcome the quantization effect and linearize the ADC response, but they can cause non-linearity in analog parts of the loop.

Prior IPSG implementations use an analog current source to inject current into a sense wire. The voltage generated by the resistance of the wire to the current injection is the signal seen by the closed loop. In general, the current sources have programmable amplitude and are enabled through an external clock signal so that the current sources can have a variable frequency. IPSG solutions in analog systems have been proven to work very well. However, using the analog IPSG in a mixed mode system with an analog to digital block causes non-linearity of very small signals due to quantization limits.

Embodiments provide a digital IPSG that injects a digital signal directly into the digital controller 116, bypassing the ADC and avoiding the quantization non-linearity. The signal injector can include a mux that selects an error bin table with values in the table offset from each other by a constant (not necessarily uniform) number. A controllable clock drives the mux to select different table values at the clock frequency, essentially injecting the table offsets as signal into the loop.

When the digital IPSG is enabled, a linear change in the error table offsets results in a linear change in the output modulation. Conversely, if an analog IPSG is being used, a small change in amplitude will result in a non-linear output signal. To be specific, a linear increment in analog IPSG amplitude may result in almost no change in the observed output, or it may result in a disproportionally large change.

Embodiments include a digital IPSG that provides an improvement over legacy analog IPSG solutions when used in mixed-mode (analog and digital) control loops. Traditional analog IPSG is effective for closed loop characterization in analog voltage regulators. For background on the legacy analog IPSG a "Signal Injector" includes programmable current sources that inject periodic square wave currents into a feedback sense lines to generate a voltage at the input of an instrumentation amplifier. This voltage signal causes a linear response at the output of the VR, and simplistically speaking, the loop characteristics such as frequency dependent gain and phase can be determined by dividing the output by the input (a frequency domain analysis like fast Fourier transform (FFT) is required).

Figure 8:
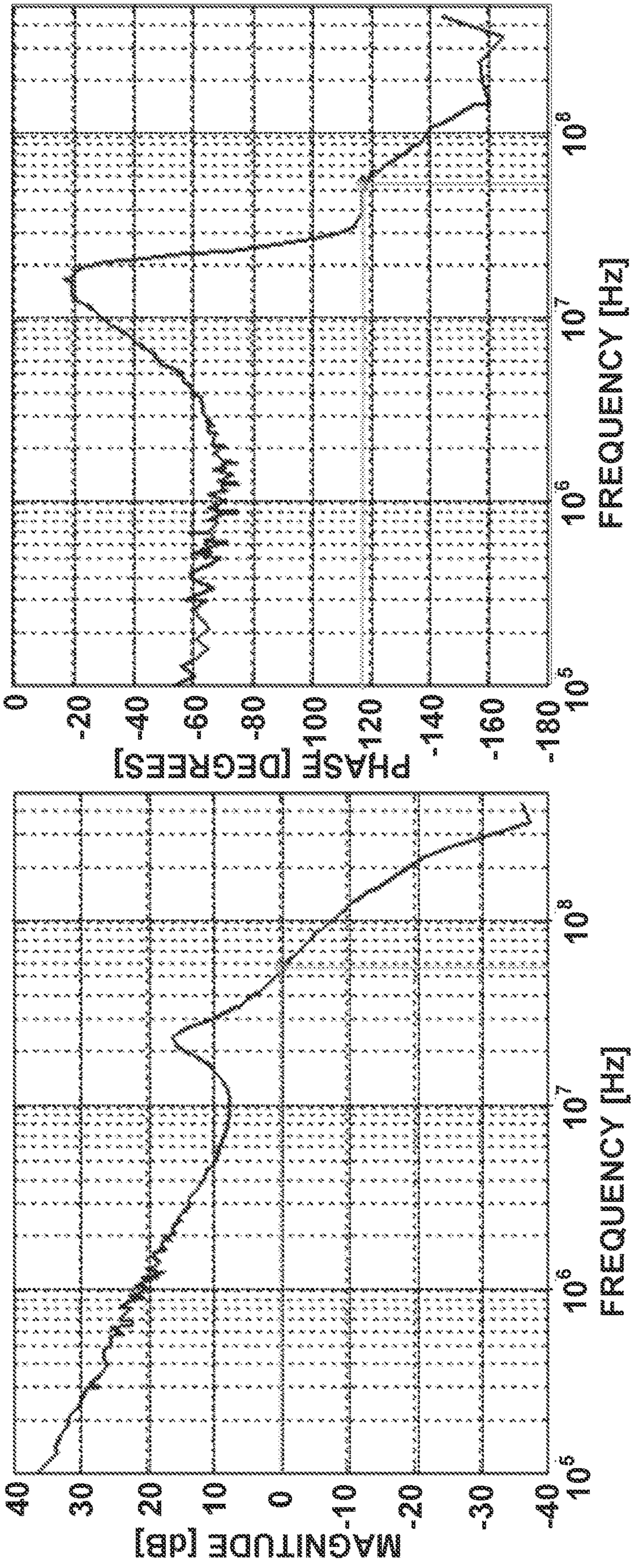
FIG. 8 illustrates, by way of example, respective plots of magnitude and phase versus frequency for an analog VR with an integrated periodic signal generator (IPSG).

FIG. 8 illustrates, by way of example, respective plots of magnitude and phase versus frequency for an analog VR with an IPSG. The plots helps determine at what frequency the VR will no longer operate reliably due to gain or phase problems. The typical IPSG comprised of variable current sources does not work in a DLVR as previously discussed.

While IPSG solutions in analog systems have been proven to work very well, using an analog IPSG in a mixed mode system (analog comparators with digitally controlled PGs) containing an ADC (the comparator bank 160) causes a non-linearity of very small signals due to limited resolution (i.e. quantization errors). For example, the DAC 132 and the comparator bank 160 form the DLVR flash. Referring again to FIG. 5, it illustrates a plot of calculated gain versus signal amplitude of the ADC. Unlike an analog VR loop, which is most linear when the voltage signal is smallest, the ADC is highly non-linear as the voltage signal approaches zero.

Embodiments regard a digital IPSG that injects a digital signal directly into the digital controller 116, bypassing the ADC and avoiding the quantization non-linearity. The signal injector includes a mux that selects an error bin table to be used by the controller 116. A first error table can be the default error table for the normal closed loop. A second error table can include the default table entries but with values offset slightly positive or negative corresponding to the size of the signal being injected. The clock 110 drives the mux to selected different tables at the clock frequency, essentially injecting the table offsets as signal into the loop.

In simulation and pre-silicon one can adjust inputs and signals in the system, such as by opening the control loop and injecting small signals or running alternating current (AC) simulations or the like. But then in practice, on the manufactured controller, the loop remains closed and there may not be an ideal small signal generator that can test the operation of the controller 116 with small to large perturbances at a variety of frequencies. Further, injecting a small analog signal into the DLVR does not provide information regarding the linear gain of the control system. As can be seen in FIG. 5, a small perturbance in input to the comparators of the comparator bank 160 can change the gain by a hundred or even a thousand. For example, at about 14 milli-Volts, the gain is about 600 while at 16 milli-Volts, the gain is about 1000 milli-Volts. Embodiments provide a digital IPSG that can provide perturbances into a DLVR to determine the linear response of the DLVR.

Figure 9:
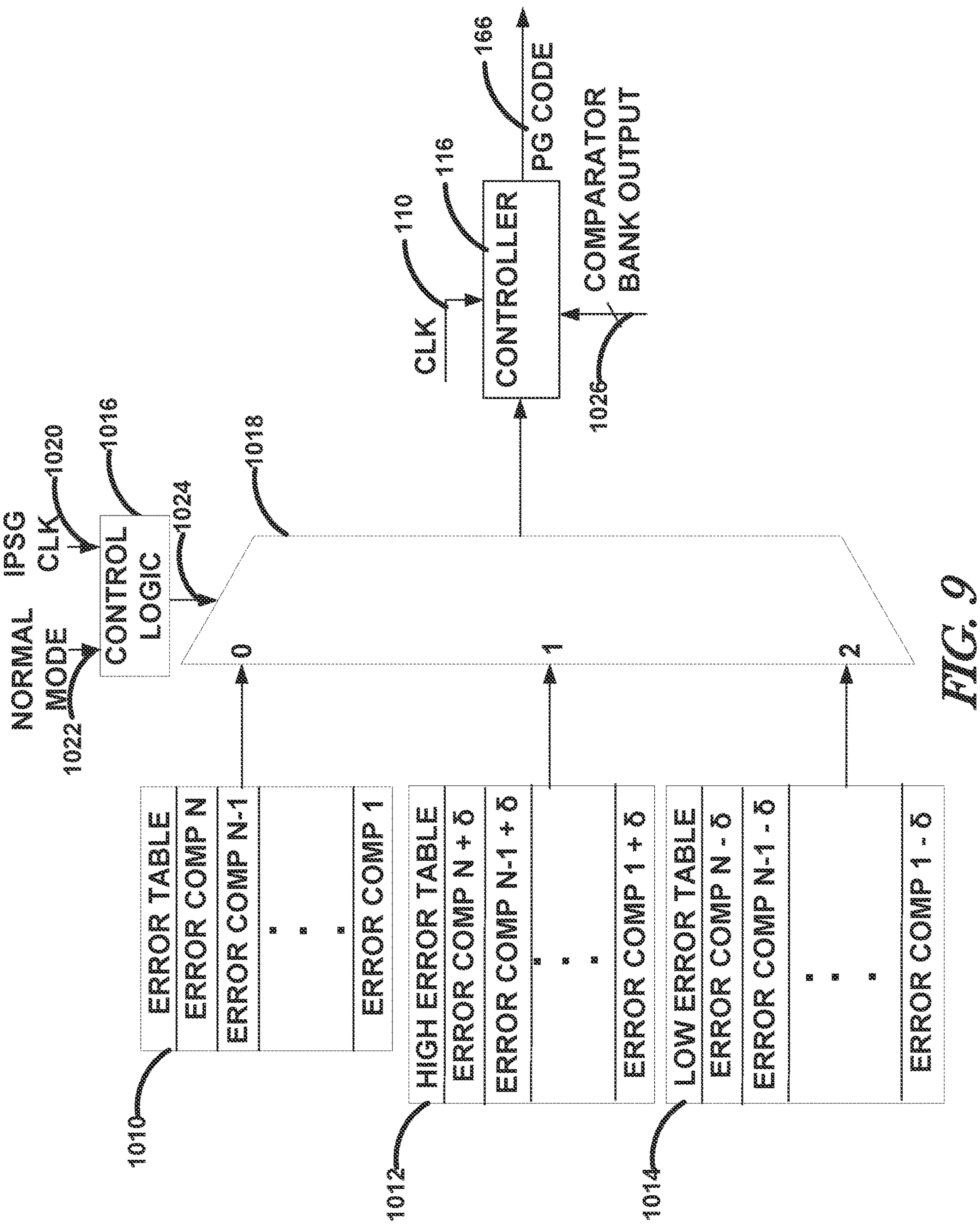
FIG. 9 illustrates, by way of example, a diagram of an embodiment of a digital IPSG system coupled with the LC circuitry (that implements proportional integral-derivative (PID) control, for example).

FIG. 9 illustrates, by way of example, a diagram of an embodiment of a digital IPSG system coupled with the LC circuitry 112 (that implements PID control, for example). The IPSG system includes three error tables 1010, 1012, 1014. A first error table 1010 is the one used in normal operation (when IPSG is not being performed). The first error table 1010 defines digital errors that are selectable by the LC circuitry 112. The controller 116 receives outputs from the comparators of the comparator bank 160 and selects the entry of the error table 1010 corresponding to the lowest or highest comparator that has tripped based on the voltage 149. For example, if there are seven comparators (one for each threshold voltage, such as an NLC undershoot threshold voltage, a gradual NLC undershoot threshold voltage, an LC undershoot threshold voltage, a reference voltage, an LC overshoot threshold voltage, a gradual NLC overshoot threshold voltage, and an NLC overshoot threshold voltage) then there are eight entries in the error table 1010. Respective entries define how much digital error is injected into the PG code 166. In the example of seven comparators, respective entries correspond to error injected when (i) the NLC undershoot threshold is exceeded, (ii) the gradual NLC undershoot threshold is exceeded and the NLC undershoot threshold is not exceeded, (iii) the LC undershoot threshold is exceeded and the gradual NLC undershoot threshold is not exceeded, (iv) the LC undershoot threshold is not exceeded and VOUT is less than the reference voltage, (v) the LC overshoot threshold is not exceeded and VOUT is greater than the reference voltage, (vi) the LC overshoot threshold is exceeded and the gradual NLC overshoot threshold is not exceeded, (vii) the gradual NLC overshoot threshold is exceeded and the NLC overshoot threshold is not exceeded, and (viii) the NLC overshoot threshold is exceeded. Seven comparators is merely an example, and as discussed elsewhere, there can be systems with three comparators, nine comparators, more comparators, or some number of comparators therebetween.

A second error table 1012 includes the same number of entries as the first error table 1010. The entries in the error table 1012 include the corresponding values from the first error table 1010 plus a programmable offset. The programmable offset can be defined in the configuration data 135 (see FIG. 1). The amount of offset can be the same across all the entries or can be different for different entries.

A third error table 1014 includes the same number of entries as the first error table 1010. The entries in the error table 1014 include the corresponding values from the first error table 1010 minus a programmable offset. The programmable offset can be defined in the configuration data 135 (see FIG. 1). The amount of offset can be the same across all the entries or can be different for different entries. The amount of offset can be greater than or less than a difference between error codes in the error table 1010. By making the offset less than the difference between any two error codes in the error table 1010, controller 116 will operate as if there were an additional comparator with a threshold between the two comparators on either side of the sense voltage. By making the offset greater than the difference between any two error codes in the table 1010, the controller 116 will inject error as if an additional comparator existed with threshold between two comparators both on one side of the sense voltage. By making the offset equal to the difference between two error codes, controller 116 will operate as if the next comparator had tripped.

A multiplexer 1018 can be controlled to select which error table 1010, 1012, 1014 is used by the controller 116 to generate the PG code 166. The multiplexer 1018 can be controlled by control logic 1016 that operates based on an IPSG clock 1020 and a normal mode signal 1022.

The normal mode signal 1022, when asserted (or de-asserted if negative logic is used) makes the control logic generate a binary zero "00" control code 1024 and the multiplexer 1018 select the error table 1010 that is used in normal operation. When the normal mode signal 1022 is de-asserted and the IPSG clock 1020 is high (or low if negative logic is used), the control logic 1016 produces a binary one "01" control code 1024 and the multiplexer 1018 selects the error table 1012 that is used to add a delta to the PG code 166 by the controller 116. When the normal mode signal 1022 is de-asserted and the IPSG clock 1020 is low (or high if negative logic is used), the control logic 1016 produces a binary two "10" control code 1024 and the multiplexer 1018 selects the error table 1014 that is used to subtract a delta and cause the controller 116 to reduce the PG code 166.

The normal mode signal 1022 is configurable, such as by the configuration data 135. The IPSG clock 1020 is a frequency-controllable oscillator. The frequency of the IPSG clock 1020 can be adjusted by adjusting the configuration data 135.

As previously discussed, the controller 116 determines which entry of the error table 1010, 1012, 1014 to select based on the output 1026 from the comparators (e.g., a stabilized version of the output from the comparators of the comparator bank 160 from the synchronizer/stabilizer 120. The entry of the table then informs the PG code 166 that is generated by the controller 116. The controller 116 is operated using the clock 110 which is separate and distinct from the IPSG cik 1020. This allows the IPSG injection to be clocked asynchronous to the clock 110 and provides for more flexible IPSG testing.

In instances in which the LC circuitry 112 implements PID control, the delta value can affect future operation of the PID. To propagate the errors from the present cycle to the next cycle, and speed up PID operation, additional error tables can be generated and selected using a different multiplexer that operates with the same control logic. This multiplexer would be in parallel with the multiplexer 1018 and provide gain adjusted feedback values used by the PID. The gain adjusted feedback values can be stored in three error tables similar to those in FIG. 9 but multiplied by the gain factor used by the PID for an immediately prior cycle.

Figure 10:
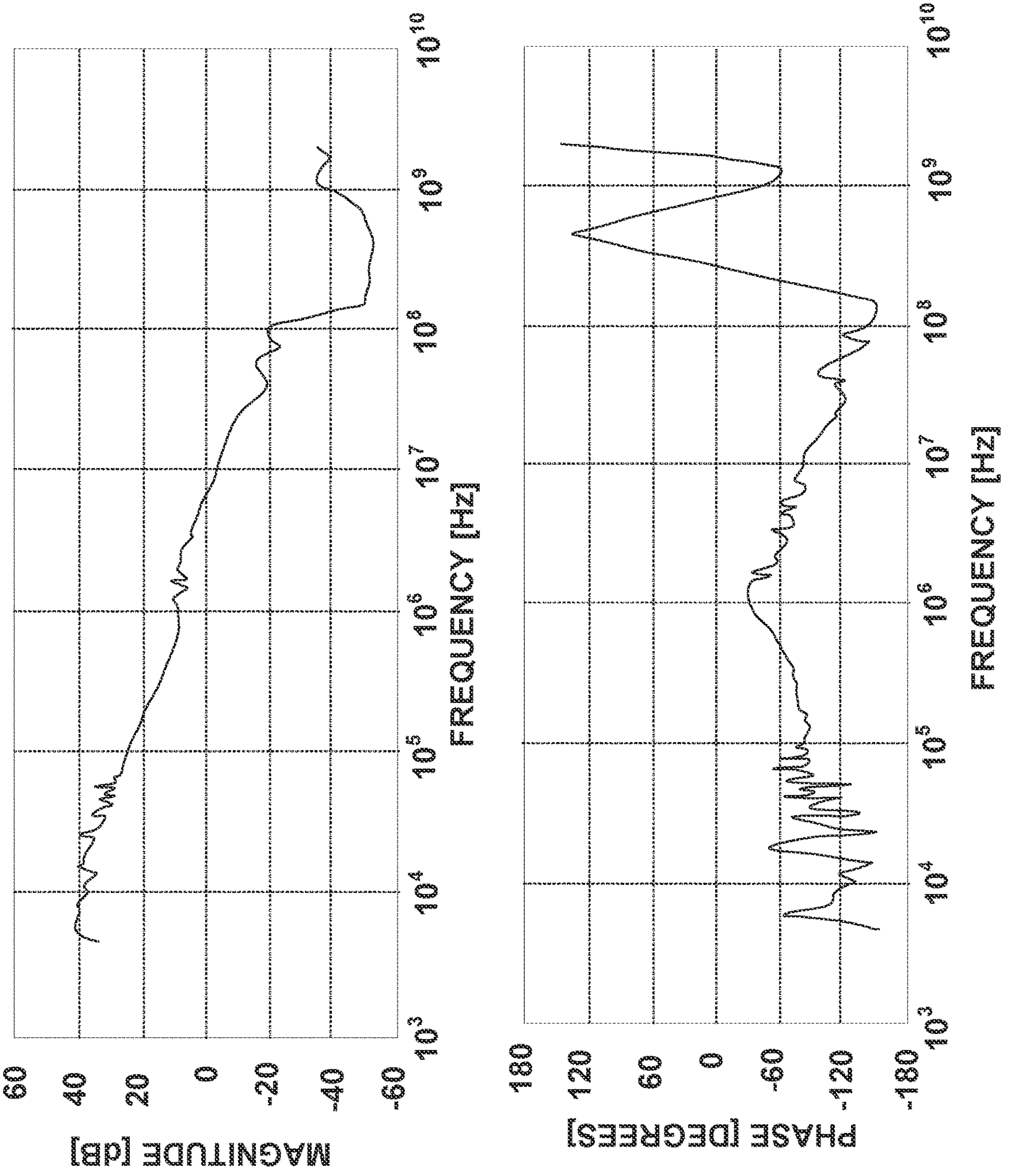
FIG. 10 illustrates, by way of example, respective plots of magnitude and phase versus frequency for a DLVR using digital IPSG.

FIG. 10 illustrates, by way of example, respective plots of magnitude and phase versus frequency for a DLVR using digital IPSG. The bandwidth and phase margin results were in line with design calculations. Note that due to the discrete time nature of the digital controller, the digital IPSG cannot generate signal frequencies higher than half the digital controller clock frequency without aliasing. The Nyquist limit is a limitation of the digital controller 116, not the digital IPSG. An analog IPSG would also produce aliased signals if operated higher than half the controller clock frequency.

Figure 11:
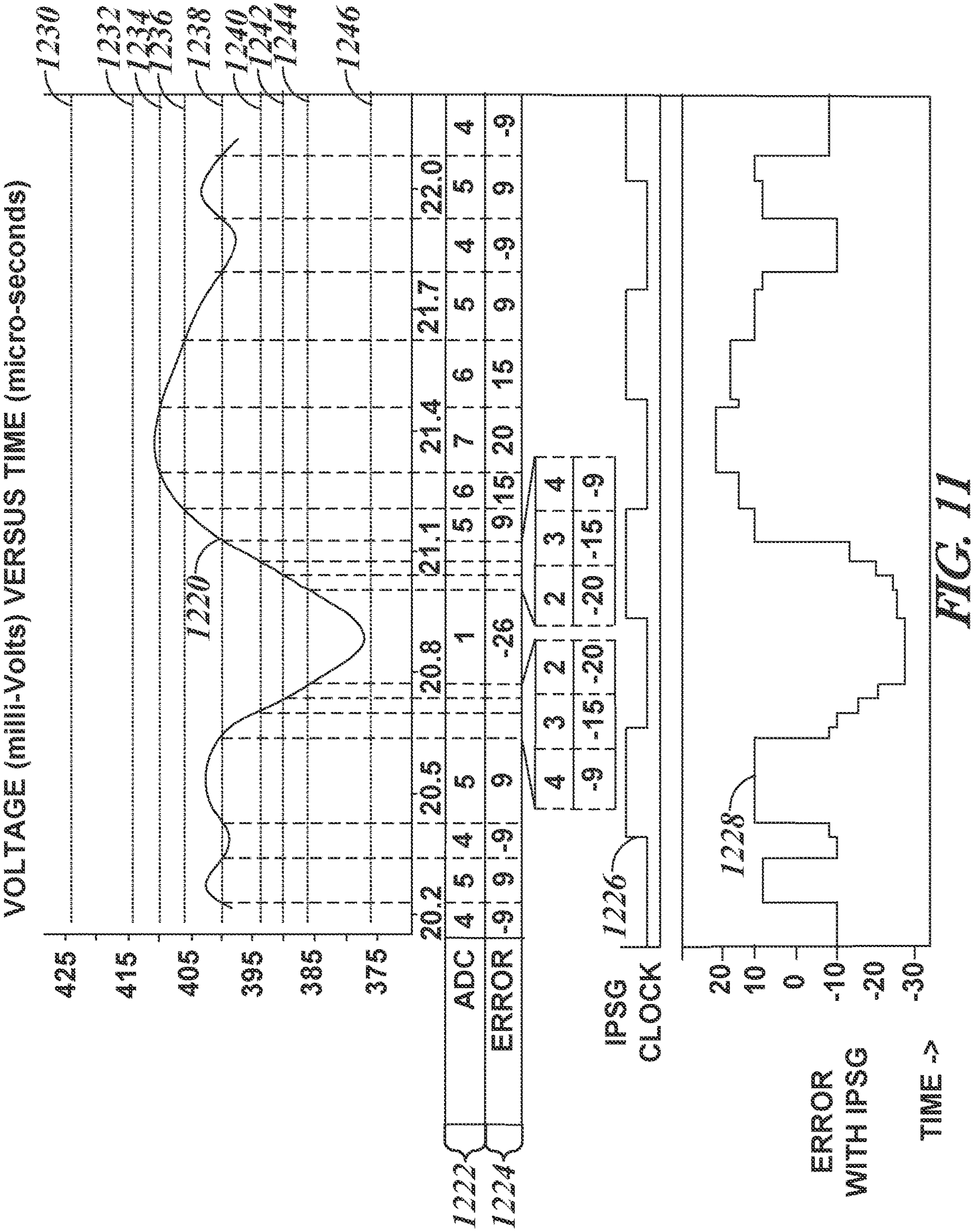
FIG. 11 illustrates, by way of example, respective time-synched graphs and charts of (i) output voltage versus time for a DLVR operating using the controller, (ii) ADC output value, (iii) digital error value used by the controller without IPSG, (iv) IPSG clock value versus time, and (v) digital error value used by the controller with IPSG.

FIG. 11 illustrates, by way of example, respective time-synched graphs and charts of (i) output voltage versus time for a DLVR operating using the controller 116, (ii) ADC output value, (iii) digital error value used by the controller 116 without IPSG, (iv) IPSG clock value 1226 versus time, and (v) digital error value used by the controller 116 with IPSG. The delta value injected by the IPSG in the example of FIG. 11 is a binary one "01". Line 1220 indicates the output voltage 149 over time. Each of nine threshold voltages is labelled in the top graph. The nine voltage thresholds include a NLC overshoot threshold voltage 1230, a gradual NLC overshoot threshold voltage 1232, an upper LC overshoot threshold voltage 1234, a lower LC overshoot threshold voltage 1236, a middle reference voltage 1238, an upper LC undershoot threshold voltage 1240, a lower LC undershoot threshold voltage 1242, a gradual NLC undershoot threshold voltage 1244, and an NLC undershoot threshold voltage 1246. Each of the threshold voltages can be provided as input to a different comparator of the comparator bank 160 that provides a digital output indicating whether output voltage 149 is greater than the threshold voltage at the input.

ADC values 1222 correspond to output of the comparator bank 160. A value of "4" means that the first four comparators (from lowest threshold voltage to highest threshold voltage input) have tripped and the remaining comparators have not tripped. A value of "5" means that the first five comparators have tripped, and the remaining comparators have not tripped and so on. The error value 1224 is the value that is returned from the error table 1010 when the controller 116 references the error table 1010 indexed by the ADC value 1222. Table 1 shows the error table 1010 from the example of FIG. 11.

TABLE 1

Example ADC and corresponding example error values for a 9 comparator ADC

| ADC VALUE | ERROR |
|---|---|
| 9 | 36 |
| 8 | 26 |
| 7 | 20 |
| 6 | 15 |
| 5 | 9 |
| 4 | −9 |
| 3 | −15 |
| 2 | −20 |
| 1 | −26 |
| 0 | −36 |

In the example of FIG. 11 it is assumed that normal mode signal 1022 is de-asserted. When the IPSC clock 1020 is high (as indicated by the IPSG clock value 1226) a binary "0000001" is added to the error value 1224 and when the IPSG clock 1020 is low a binary "0000001" is subtracted from the error value 1224 in the example of FIG. 11. The resulting error with IPSG adjustment versus time is indicated by line 1228. Instead of performing the addition or subtraction at run time, the digital IPSG can switch the lookup table used by the controller 116 to determine the error. Examples of the high error table 1012 (storing values equal to the values in the error table 1010 plus the delta) and the low error table 1014 (storing values equal to the values in the error table 1010 minus the delta) are provided in Tables 2 and 3, respectively. The high error table 1012 can be selected when the IPSG clock 1020 is high and the low error table 1014 can be selected when the IPSG clock 1020 is low.

TABLE 2

Example high error table for 9 comparator ADC

| ADC VALUE | ERROR + delta |
|---|---|
| 9 | 37 |
| 8 | 27 |
| 7 | 21 |
| 6 | 16 |
| 5 | 10 |
| 4 | −8 |
| 3 | −14 |
| 2 | −19 |
| 1 | −25 |
| 0 | −35 |

TABLE 2

Example low error table for 9 comparator ADC

| ADC VALUE | ERROR − delta |
|---|---|
| 9 | 35 |
| 8 | 25 |
| 7 | 19 |
| 6 | 14 |
| 5 | 8 |
| 4 | −10 |
| 3 | −16 |
| 2 | −21 |
| 1 | −27 |
| 0 | −37 |

Responsive to the clock value 1226 switching from low to high the controller 116 can be provided, by digital IPSG circuitry (e.g., the control logic 1016, multiplexer 1018, error tables 1010, 1012, 1014, or a combination thereof) with the high error table 1012. Responsive to the clock value 1226 switching from high to low the controller 116 can be provided, by the digital IPSG circuitry, with the low error table 1014.

Figure 12:
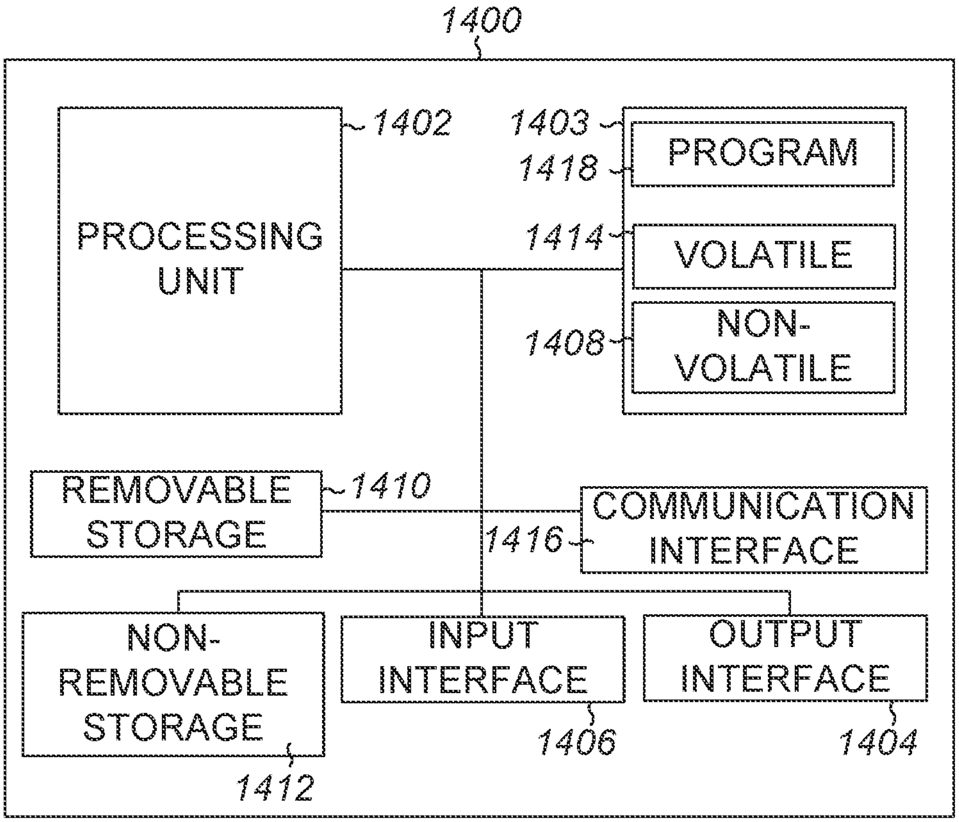
FIG. 12 illustrates, by way of example, a block diagram of an embodiment of a machine (e.g., a computer system) to implement one or more embodiments of controller logic.

FIG. 12 illustrates, by way of example, a block diagram of an embodiment of a machine 1400 (e.g., a computer system) to implement one or more embodiments of controller logic. The machine 1400 can implement a technique for improved VR controller operation. The VR controller 116 or a component thereof can include one or more of the components of the machine 1400. One or more of the VR controller 116, method 800, 1300, or a component or operations thereof can be implemented, at least in part, using a component of the machine 1400. One example machine 1400 (in the form of a computer), may include a processing unit 1402, memory 1403, removable storage 1410, and non-removable storage 1412. Although the example computing device is illustrated and described as machine 1400, the computing device may be in different forms in different embodiments. Further, although the various data storage elements are illustrated as part of the machine 1400, the storage may also or alternatively include cloud-based storage accessible via a network, such as the Internet.

Memory 1403 may include volatile memory 1414 and non-volatile memory 1408. The machine 1400 may include—or have access to a computing environment that includes—a variety of computer-readable media, such as volatile memory 1414 and non-volatile memory 1408, removable storage 1410 and non-removable storage 1412. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 1400 may include or have access to a computing environment that includes input 1406, output 1404, and a communication connection 1416. Output 1404 may include a display device, such as a touchscreen, that also may serve as an input device. The input 1406 may include one or more of a touchscreen, touchpad, mouse, keyboard, camera, one or more device-specific buttons, one or more sensors integrated within or coupled via wired or wireless data connections to the machine 1400, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 802.11 (Wi-Fi), Bluetooth, or other networks.

Computer-readable instructions stored on a computer-readable storage device are executable by the processing unit 1402 (sometimes called processing circuitry) of the machine 1400. A hard drive, CD-ROM, and RAM are some examples of articles including a non-transitory computer-readable medium such as a storage device. For example, a computer program 1418 may be used to cause processing unit 1402 to perform one or more methods or algorithms described herein.

Note that the term "circuitry" as used herein refers to, is part of, or includes hardware components, such as transistors, resistors, capacitors, diodes, inductors, amplifiers, oscillators, switches, multiplexers, logic gates (e.g., AND, OR, XOR), power supplies, memories, or the like, such as can be configured in an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

ADDITIONAL NOTES AND EXAMPLES

Example 1 includes a digital-to-analog converter (DAC) comprising a first resistor ladder including a plurality of first electrical taps into different portions of the first resistor ladder, first and second pass gate trees coupled to receive outputs from the first electrical taps, first and second buffers coupled to receive outputs from the first and second pass gate trees, respectively, a second resistor ladder coupled to receive and be biased by outputs of the first and second buffers, the second resistor ladder including a plurality of second electrical taps into different portions of the second resistor ladder, and third, fourth, and fifth pass gate trees coupled to receive outputs from the second electrical taps.

In Example 2, Example 1 further includes, wherein the DAC receives configuration data indicating threshold voltages for each of a plurality of comparators and digitally alters the first, second, third, fourth, and fifth pass gate trees to provide the threshold voltages at outputs of the third, fourth, and fifth pass gate trees.

In Example 3, Example 2 further includes first, second, and third capacitors coupled to an output of the third, fourth, and fifth pass gate trees.

In Example 4, Example 3 further includes a control input to each respective pass gate, of the third, fourth, and fifth pass gate trees, that provides the output for the third, fourth, and fifth pass gate trees electrically coupled to a blanking signal.

In Example 5, Example 4 further includes, wherein the blanking signal, when asserted, causes the respective pass gate to provide no signal on the outputs of the third, fourth, and fifth pass gate trees, and the first, second, and third capacitors maintain a voltage to the corresponding outputs.

In Example 6, Example 5 further includes, wherein the blanking signal is asserted responsive to receiving configuration data indicating a change in one or more of the threshold voltages and before altering a configuration of any of the first, second, third, fourth, and fifth pass gate trees.

In Example 7, at least one of Examples 1-6 further includes, wherein outputs of the DAC include a reference voltage for a current regulator.

Example 8 includes a digital linear voltage regulator (DLVR) comprising controller circuitry, comparators coupled to provide respective outputs to the controller circuitry, and a digital to analog converter (DAC) coupled to the comparators, the DAC comprising a first resistor ladder, first and second pass gate trees coupled to receive outputs from the first resistor ladder, first and second buffers coupled to receive outputs from the first and second pass gate trees, respectively, a second resistor ladder coupled to receive and be biased by outputs of the first and second buffers, and third, fourth, and fifth pass gate trees coupled to receive outputs from the second resistor ladder and to provide a respective threshold voltage of threshold voltages to a respective comparator of the comparators.

In Example 9, Example 8 further includes, wherein the controller circuitry is configured to digitally alter one of the threshold voltages based on a determined offset in a comparator of the comparators.

In Example 10, Example 9 further includes, wherein the controller circuitry is configured to sweep a trim code of a comparator of the comparators and adjust an analog trim of the comparator based on an output of the comparator.

In Example 11, at least one of Examples 8-10 further includes, wherein the controller circuitry receives configuration data indicating threshold voltages for each of the comparators and digitally alters the first, second, third, fourth, and fifth pass gate trees to provide the threshold voltages at outputs of the third, fourth, and fifth pass gate trees.

In Example 12, at least one of Examples 8-11 further includes first, second, and third capacitors coupled to an output of the third, fourth, and fifth pass gate trees.

In Example 13, Example 12 further includes a control input to each respective pass gate, of the third, fourth, and fifth pass gate trees, that provides the output for the third, fourth, and fifth pass gate trees electrically coupled to a blanking signal.

In Example 14, Example 13 further includes, wherein the blanking signal, when asserted, causes the respective pass gate to provide no signal on the output of the third, fourth, and fifth pass gate trees, and the first, second, and third capacitors maintain a voltage the corresponding outputs.

In Example 15, Example 14 further includes, wherein the blanking signal is asserted responsive to receiving configuration data indicating a change in one or more of the threshold voltages and before altering a configuration of any of the first, second, third, fourth, and fifth pass gate trees.

In Example 16, at least one of Examples 8-15 further includes a current regulator configured to provide a reference voltage of the threshold voltages to a buffer coupled between the DAC and the current regulator.

In Example 17, at least one of Examples 8-16 further includes, wherein the controller includes linear control, gradual non-linear control, and non-linear control.

Example 18 includes a digital linear voltage regulator (DLVR) comprising power gates (PGs) configured to provide an output to drive a load, comparators configured to generate a digital value indicating a magnitude of a voltage of the load, controller circuitry configured to alter a number of the PGs that are operating based on the digital value, and a digital to analog converter (DAC) coupled to the comparators, the DAC comprising a first resistor ladder, first and second pass gate trees coupled to receive outputs from the first resistor ladder, first and second unity gain buffers coupled to receive outputs from the first and second pass gate trees, respectively, a second resistor ladder coupled to receive and be biased by outputs of the first and second buffers, and third, fourth, and fifth pass gate trees coupled to receive outputs from the second resistor ladder and to provide a respective threshold voltage of threshold voltages to a respective comparator of the comparators.

In Example 19, Example 18 further includes, wherein the controller circuitry is configured to digitally trim one of the threshold voltages based on a determined voltage offset in inputs of a comparator of the comparators.

In Example 20, at least one of Examples 18-19 further includes first, second, and third capacitors coupled to an output of the third, fourth, and fifth pass gate trees, and a control input to each respective pass gate, of the third, fourth, and fifth pass gate trees, that provides the output for the third, fourth, and fifth pass gate trees electrically coupled to a blanking signal.

Example 21 includes a digital linear voltage regulator (DLVR) comprising comparators to provide a digital word indicating an amount of error in an output of the DLVR, a memory storing a first error table and a second error table, the first error table indicating respective digital error codes for each of the comparators, and the second error table indicating respective first adjusted error codes for each of the comparators, the first adjusted error codes are the digital error codes adjusted by a programmable delta value, and controller circuitry configured to receive the digital word and use it as an index into the second error table to provide a first adjusted error code of the first adjusted error codes corresponding to the index, and determine a power gate (PG) code based on the first adjusted error code.

In Example 22, Example 21 further includes a multiplexer coupled between controller circuitry 116 and the first and second error tables.

In Example 23, Example 22 further includes, wherein the multiplexer receives the first error table at a first input and the second error table at the second input.

In Example 24, Example 23 further includes control logic coupled to receive a normal mode signal and a clock signal and control output of the multiplexer based on the normal mode signal and the clock signal.

In Example 25, Example 24 further includes, wherein the first adjusted error codes are the error codes plus the programmable delta value and the DLVR further comprises a third error table indicating respective second adjusted error codes for each of the comparators, the second adjusted error codes are the error codes minus the programmable delta value.

In Example 26, Example 25 further includes, wherein the control logic is configured to select the first error table when the normal mode signal is asserted.

In Example 27, Example 26 further includes, wherein the control logic is configured to select the second error table when the normal mode signal is de-asserted, and the clock signal is asserted.

In Example 28, Example 27 further includes, wherein the control logic is configured to select the third error table when the normal mode signal is de-asserted, and the clock signal is de-asserted.

In Example 29, at least one of Examples 24-28 further includes, wherein the clock signal is provided by a variable frequency oscillator.

In Example 30, Example 29 further includes, wherein the controller circuitry is coupled to a second, different clock signal.

Example 31 includes a digital linear voltage regulator (DLVR) comprising controller circuitry, and an integrated periodic signal generator (IPSG) comprising a memory storing a first error table and a second error table, the first error table indicating respective digital error codes indicating an amount of error in an output voltage of the DLVR, and the second error table indicating respective first adjusted error codes, the first adjusted error codes are the digital error codes adjusted by a programmable delta value, and a multiplexer configured to provide the first and second error tables to the controller circuitry based on a control signal.

In Example 32, Example 31 further includes, wherein the multiplexer includes the first error table coupled to a first input thereof and the second error table coupled to a second input thereof.

In Example 33, Example 32 further includes, wherein the IPSG further comprises control logic coupled to receive a normal mode signal and a clock signal and generate the control signal based on the normal mode signal and the clock signal.

In Example 34, Example 33 further includes, wherein the first adjusted error codes are the error codes plus the programmable delta value and the DLVR further comprises a third error table indicating respective second adjusted error codes for each of the comparators, the second adjusted error codes are the error codes minus the programmable delta value.

In Example 35, Example 34 further includes, wherein the control logic is configured to select the first error table when the normal mode signal is asserted.

In Example 36, Example 35 further includes, wherein the control logic is configured to select the second error table when the normal mode signal is de-asserted, and the clock signal is asserted.

In Example 37, Example 36 further includes, wherein the control logic is configured to select the third error table when the normal mode signal is de-asserted, and the clock signal is de-asserted.

In Example 38, at least one of Examples 33-37 further includes, wherein the clock signal is provided by a variable frequency oscillator.

Example 39 includes a digital linear voltage regulator (DLVR) comprising comparators to provide a digital word indicating an amount of error in an output of the DLVR, a memory storing a first error table, a second error table, and a third error table, the first error table including respective digital error codes for each of the comparators, the second error table including respective first adjusted error codes for each of the comparators, and the third error table including respective second adjusted error coded, the first adjusted error codes are the digital error codes plus a programmable delta value, and the second adjusted error codes are the digital error codes minus the programmable delta value, a multiplexer including a first error table coupled to a first input thereof, the second error table coupled to a second input thereof, and the third error table coupled to a third input thereof, control logic configured to select which of the first, second, and third inputs to provide at an output of the multiplexer, and controller circuitry configured to receive the digital word and the output of the multiplexer and adjust a power gate code based on the digital word and the output.

In Example 40, Example 39 further includes a variable frequency clock to provide a clock signal to the control logic, wherein the controller circuitry is configured to provide a normal mode signal to the control logic, wherein the control logic is configured to select the first input when the normal mode signal is asserted, wherein the control is configured to select the second input when the normal mode signal is de-asserted and the clock signal is asserted, and wherein the control logic is configured to select the third input when the normal mode signal is de-asserted, and the clock signal is de-asserted.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A digital-to-analog converter (DAC) comprising:

a first resistor ladder including a plurality of first electrical taps into different portions of the first resistor ladder;

first and second pass gate trees coupled to receive outputs from the first electrical taps;

first and second buffers coupled to receive outputs from the first and second pass gate trees, respectively;

a second resistor ladder coupled to receive and be biased by outputs of the first and second buffers, the second resistor ladder including a plurality of second electrical taps into different portions of the second resistor ladder; and third, fourth, and fifth pass gate trees coupled to receive outputs from the second electrical taps, wherein the DAC is structured to receive configuration data indicating threshold voltages for each of a plurality of comparators to digitally alter the first, second, third, fourth, and fifth pass gate trees to provide the threshold voltages at outputs of the third, fourth, and fifth pass gate trees.

2. The DAC of claim 1, further comprising first, second, and third capacitors coupled to an output of the third, fourth, and fifth pass gate trees.

3. The DAC of claim 2, further comprising a control input to each respective pass gate, of the third, fourth, and fifth pass gate trees, that provides the output for the third, fourth, and fifth pass gate trees electrically coupled to a blanking signal.

4. The DAC of claim 3, wherein the blanking signal, when asserted, causes:

the respective pass gate to provide no signal on the outputs of the third, fourth, and fifth pass gate trees; and the first, second, and third capacitors to maintain a voltage the corresponding outputs.

5. The DAC of claim 4, wherein the blanking signal is asserted responsive to receiving configuration data indicating a change in one or more of the threshold voltages and before altering a configuration of any of the first, second, third, fourth, and fifth pass gate trees.

6. The DAC of claim 1, wherein outputs of the DAC include a reference voltage for a current regulator.

7. A digital linear voltage regulator (DLVR) comprising:

controller circuitry;

comparators coupled to provide respective outputs to the controller circuitry; and a digital to analog converter (DAC) coupled to the comparators, the DAC comprising:

a first resistor ladder;

first and second pass gate trees coupled to receive outputs from the first resistor ladder;

first and second buffers coupled to receive outputs from the first and second pass gate trees, respectively;

a second resistor ladder coupled to receive and be biased by outputs of the first and second buffers; and third, fourth, and fifth pass gate trees coupled to receive outputs from the second resistor ladder and to provide a respective threshold voltage of threshold voltages to a respective comparator of the comparators.

8. The DLVR of claim 7, wherein the controller circuitry is configured to digitally alter one of the threshold voltages based on a determined offset in a comparator of the comparators.

9. The DLVR of claim 8, wherein the controller circuitry is configured to sweep a trim code of a comparator of the comparators and adjust an analog trim of the comparator based on an output of the comparator.

10. The DLVR of claim 7, wherein the controller circuitry receives configuration data indicating threshold voltages for each of the comparators and digitally alters the first, second, third, fourth, and fifth pass gate trees to provide the threshold voltages at outputs of the third, fourth, and fifth pass gate trees.

11. The DLVR of claim 7, further comprising first, second, and third capacitors coupled to an output of the third, fourth, and fifth pass gate trees.

12. The DLVR of claim 11, further comprising a control input to each respective pass gate, of the third, fourth, and fifth pass gate trees, that provides the output for the third, fourth, and fifth pass gate trees electrically coupled to a blanking signal.

13. The DLVR of claim 12, wherein the blanking signal, when asserted, causes:

the respective pass gate to provide no signal on the output of the third, fourth, and fifth pass gate trees; and the first, second, and third capacitors to maintain a voltage of the corresponding outputs.

14. The DLVR of claim 13, wherein the blanking signal is asserted responsive to receiving configuration data indicating a change in one or more of the threshold voltages and before altering a configuration of any of the first, second, third, fourth, and fifth pass gate trees.

15. The DLVR of claim 7, further comprising a current regulator configured to provide a reference voltage of the threshold voltages to a buffer coupled between the DAC and the current regulator.

16. The DLVR of claim 7, wherein the controller includes linear control, gradual non-linear control, and non-linear control.

17. A digital linear voltage regulator (DLVR) comprising:

power gates (PGs) configured to provide an output to drive a load;

comparators configured to generate a digital value indicating a magnitude of a voltage of the load;

controller circuitry configured to alter a number of the PGs that are operating based on the digital value; and a digital to analog converter (DAC) coupled to the comparators, the DAC comprising:

a first resistor ladder;

first and second pass gate trees coupled to receive outputs from the first resistor ladder;

first and second unity gain buffers coupled to receive outputs from the first and second pass gate trees, respectively;

a second resistor ladder coupled to receive and be biased by outputs of the first and second buffers; and third, fourth, and fifth pass gate trees coupled to receive outputs from the second resistor ladder and to provide a respective threshold voltage of threshold voltages to a respective comparator of the comparators.

18. The DLVR of claim 17, wherein the controller circuitry is configured to digitally trim one of the threshold voltages based on a determined voltage offset in inputs of a comparator of the comparators.

19. The DLVR of claim 17, further comprising:

first, second, and third capacitors coupled to an output of the third, fourth, and fifth pass gate trees; and a control input to each respective pass gate, of the third, fourth, and fifth pass gate trees, that provides the output for the third, fourth, and fifth pass gate trees electrically coupled to a blanking signal.

* * * * *